United States Patent [19]
Caillat et al.

[11] Patent Number: 5,861,322
[45] Date of Patent: Jan. 19, 1999

[54] PROCESS FOR MANUFACTURING AN INTERCONNECTION SUBSTRATE TO CONNECT A CHIP ONTO A RECEPTION SUBSTRATE

[75] Inventors: Patrice Caillat, Echirolles; David Henry, Grenoble, both of France

[73] Assignee: Commissariat a l'Energie Atomique, Paris, France

[21] Appl. No.: 658,684

[22] Filed: Jun. 5, 1996

[30] Foreign Application Priority Data

Jun. 30, 1995 [FR] France .................................. 95 07920

[51] Int. Cl.⁶ .................................................. H01L 21/60
[52] U.S. Cl. .......................... 438/107; 438/119; 438/617
[58] Field of Search ..................................... 438/107, 108, 438/118, 119, 461, 464, 455, 458, 459, 611–617

[56] References Cited

U.S. PATENT DOCUMENTS

| | | | |
|---|---|---|---|
| 3,621,564 | 11/1971 | Tanaka et al. | 438/616 |
| 4,582,563 | 4/1986 | Hazuki et al. | 156/643.1 |
| 5,071,787 | 12/1991 | Mori et al. | 437/183 |
| 5,151,388 | 9/1992 | Bakhit et al. | 438/107 |
| 5,258,236 | 11/1993 | Arjavalingam et al. | 428/626 |
| 5,366,794 | 11/1994 | Nakao et al. | 428/209 |
| 5,635,427 | 6/1997 | Takahashi | 438/125 |

FOREIGN PATENT DOCUMENTS

| | | |
|---|---|---|
| 0 506 077 A2 | 2/1993 | European Pat. Off. . |
| 0 560 077 A3 | 2/1993 | European Pat. Off. . |
| 4203114A1 | 2/1993 | Germany . |

OTHER PUBLICATIONS

"Ball Grid Array", TechSearch International, Inc., 1994, Month Not Known, 7 pages.

"Thin Film Transfer Process for Low Cost MCM–D Fabrication", IEEE Transactions on Components..., Part B, vol. 18, No. 1, Feb. 1995, pp. 42–46.

"Planarized Testing Pads for Thin Films in Serial Parallel process" IBM Technical Disclosure Bulletin, vol. 36, No. 6B, Jun. 1993, pp. 173–174.

Primary Examiner—T. N. Quach
Attorney, Agent, or Firm—Pearne, Gordon, McCoy & Granger LLP

[57] ABSTRACT

The process includes the following steps: forming a layer of meltable material (102) on an initial substrate (100); forming a first layer of dielectric material (104) and engraving this layer (104) to form openings (106) therein; forming metal blocks (108) in the openings (106); depositing a metal layer (110) covering the blocks; engraving the metal layer (110) to form conducting tracks (112); forming a layer of dielectric material (114) covering the conducting tracks and engraving this layer (114) to form openings therein; forming metal blocks (118) in these openings; separating the interconnection substrate from the initial substrate by heating the meltable material to a temperature equal to or exceeding its melting temperature.

13 Claims, 3 Drawing Sheets

PROCESS FOR MANUFACTURING AN INTERCONNECTION SUBSTRATE TO CONNECT A CHIP ONTO A RECEPTION SUBSTRATE

BACKGROUND OF THE INVENTION

Technical field

This invention relates to a process for manufacturing an interconnection substrate to connect a chip onto a reception substrate.

Interconnection substrates act as intermediaries for the installation of one or several electronic chips on a support, for example such as printed circuit boards. Their essential function is to adapt the very tight pitch between chip inputs and outputs with the much more widely spaced connection terminals made on printed circuit boards.

Therefore the invention is particularly applicable to electronics in which VLSI chips are used on conventional printed circuits.

As described above, the essential function of interconnection substrates is to adapt the pitch of reception substrate connection terminals to the very small pitch of chip inputs and outputs. Another also very important function is to absorb mechanical stresses that occur between the chip and the reception substrate. These stresses are mainly due to differences in thermal-mechanical expansion between the chips and the printed circuit.

As shown in section in FIGS. 1 and 2, interconnection substrates 10 comprise a side 12 with input terminals 14 connected to one or several chips 16, and a side 18, opposite side 12, with output terminals 20 connected to a reception substrate 22. Chip 16 may be connected to the input terminals 14 either through wire connections 24, called "wire bonding" (FIG. 1), or through meltable microballs 26 using a technique known as "Flip-Chip" (FIG. 2). Chip 16 is advantageously protected by a cover 17.

Interconnection substrates 10 are mounted on the reception substrate 22 by balls 28 made of a meltable material which connect output terminals 20 to reception substrate conducting tracks not shown on the figures.

The meltable balls 28 connecting the interconnection substrate to the reception substrate are usually larger than the microballs 26 which connect the chips to the interconnection substrate. Therefore, to avoid any confusion, meltable balls 28 are called "macroballs" in the remainder of this description. The typical diameter is of the order of 200 to 800 μm.

These macroballs are beneficially used instead of any other type of link such as links by pins. They are better capable of absorbing differential expansion stresses between the chips and the reception substrate and therefore reducing stresses exerted on the chips.

The connection between interconnection substrates on support substrates by means of macroballs is known as BGA ("Ball Grid Array"). Reference can be made to document (1) cited at the end of this description.

Document (1) also describes the various types of interconnection substrates and microballs used for a BGA interconnection.

In general, the interconnection substrate is based on bimaleid-triazine (BT) or epoxy glass. However, a distinction is made between BGA on a rigid interconnection substrate and BGA on a flexible circuit.

Rigid interconnection substrates have a multi-layer structure formed for example by silk screen printing on a rigid epoxy and glass fiber board.

In this type of structure, input terminals are connected to output terminals through plated through holes and possibly intermediate metal levels made in the interconnection substrate. By plated through holes is meant usually mechanically made through holes that are plated to enable electrical contact between the front and back sides or between two metal levels.

On FIGS. 1 and 2, plated through holes and intermediate metal levels are identified as reference 30. Since these figures are cross-section views, and not all terminals are necessarily in the plane of the section, some plated through holes only appear partially.

Known interconnection substrates mostly use known manufacturing techniques such as silk screen printing and electrolytic growth.

Rigid substrates formed from a multi-layer ceramic structure obtained by hot pressing are also known. Such structure is shown for example in page 12 in document (1).

Pages 65 and 66 in document (1) describe a BGA technique on a flexible circuit. The flexible circuit that forms the interconnection substrate has a copper-polyimide-copper type structure similar to that used in TAB (Tape Automatic Bonding) techniques, using a layer of a material marketed under the name of Kapton as insulator, and copper conducting films silk screen printed on one or both sides of the flexible circuit, the connection between the two sides then being made by plated through holes.

After assembling the chips on a flexible circuit strip and packaging these chips, the strip is cut out provided with macroballs and then placed on a reception printed circuit.

Finally, regardless of the intermediate substrate structure used, it is manufactured using silk screen printing, rolling and through hole plating techniques. The use of plated through holes is the only known way of transferring signals processed by chips from input terminals to output terminals.

Known interconnection substrates have poor performances for the transmission of high frequency signals from chips to the reception substrate, or between chips.

It may be noted that chips (or integrated circuits) use metal tracks usually made of aluminium with a thickness of the order of 1 μm. These tracks form transmission lines, and are isolated for example using a mineral insulation of the same thickness. The electrical transmission properties of these lines enable the transport of high frequency signals over a maximum length of 15 mm.

Therefore, integrated circuits are designed so that they are hardly larger than 15 mm along the side. However, interconnection substrates which must make connections between a large number of chips create frequency limitation problems. Therefore, in order to improve their electrical performances, the resistivity of their conducting tracks has to be reduced. Reducing the resistivity means increasing the thickness of metal tracks, and the thickness of the dielectric materials separating the conducting levels. This can be done using normal techniques for printed circuits, co-sintered multi-layer ceramics or flexible circuits, by increasing the thickness of the polyimide insulating layers (10 μm). However, this type of action limits the pitch resolution between the terminals, and the chip input and output density, which is contradictory to the primary function of interconnection substrates.

Thus, an additional intermediate interconnection substrate is used for interconnection substrates designed to hold a large number of chips, commonly called MCM (Multi-Chip-Module) interconnection substrates.

FIG. 3 shows an example of an MCM type structure. This structure, in the same way as the structures shown in FIGS. 1 and 2, comprises a reception substrate 22 provided with macroballs 28. However, several chips 16, 16' must be connected not only to the reception substrate 22, but also to each other and are connected to an additional intermediate interconnection substrate 31, rather then being directly connected to the interconnection substrate 10.

The intermediate interconnection substrate 31 is made on a silicon board and has three to five copper conducting levels separated by thick polyimide insulating layers. The purpose of the intermediate substrate is to enable fast (i.e. high frequency) signal exchanges between chips and from chips to the interconnection substrate 10.

An intermediate interconnection substrate 31, although it does provide a solution to the fast interconnection of a large number of chips, forms an additional expensive element in transferring chips onto the reception substrate. Also, three interconnection operations are necessary: an interconnection of the chips onto the additional intermediate substrate, an interconnection of the intermediate substrate onto the interconnection substrate, and then a transfer of the interconnection substrate onto the reception substrate. This increases the time and cost of the operation.

Thin film MCM type structures are also known. Examples of these structures are described for example in document (2) referenced at the end of this description.

One purpose of this invention is to provide a process for making an interconnection substrate that does not have the limitations described above.

Another purpose of this invention is to provide a process for making an interconnection substrate enabling interconnection of a plurality of chips on a reception substrate, and capable of transmitting high frequency signals. By high frequency signals is meant signals with a frequency exceeding 50 MHz.

BRIEF SUMMARY OF THE INVENTION

In order to achieve these purposes, a specific object of the invention is a process for making an interconnection substrate to connect at least one electronic chip onto a reception substrate, the interconnection substrate having a first side with input terminals adapted to be connected to the chip, and a second side, opposite the first side, with output terminals capable of being connected to the reception substrate, characterized in that this process includes the following steps:

a)—forming a layer of meltable material on a so-called initial substrate, b)—forming a first layer of dielectric material and engraving this layer to make openings corresponding to the output terminals of the interconnection substrate, c)—forming metal blocks in each of the openings, the blocks forming the output terminals, d)—depositing a metal layer covering the metal blocks, e)—engraving the metal layer to form conducting tracks, the tracks at least partially superposing the openings formed in the dielectric material layer located under the metal layer formed in step d), f)—forming a dielectric material layer covering the conducting tracks and engraving this layer to form openings therein at least partially covering the conducting tracks formed during step e), g)—forming metal blocks in the openings formed in the layer of dielectric material layer formed in step f), h)—separating the interconnection substrate from the initial substrate by heating the meltable material to a temperature equal to or exceeding its melting temperature.

According to one aspect to the invention, the process of the invention may further include between steps g) and h) a step of forming fastening studs respectively on the metal blocks formed in step g), the fastening studs forming input terminals.

Within the scope of this invention, by meltable material is meant a material with a sufficiently low melting temperature to avoid damaging the interconnection substrate and/or chips during this separation operation. For example, the melting temperature may be between 100° C. and 350° C.

The meltable material may be either a metal such as a tin-lead based alloy, or a thermoplastic polymer.

According to one aspect of the invention, during step c), the blocks may be formed by electrolysis using the layer of meltable material as electrode, and in this case the meltable material must be conducting. The layer of meltable electrically conducting material then performs two functions. Firstly, it forms an electrical contact point to control electrolytic growth of metal blocks in the first mask of dielectric material, these blocks being preferably formed by electrolysis instead of sputtering for cost reasons. Secondly, the layer of meltable material facilitates separation of the interconnection substrate from the initial substrate by heating the entire structure to a temperature exceeding the melting temperature of the meltable material. For non-conducting meltable materials, the metal blocks are formed by sputtering or vapor deposition.

The conducting tracks and openings made in the dielectric material layers are engraved using patterns chosen to connect input terminals with a small pitch to output terminals with a larger pitch. The pitch between terminals refers to the average spacing between two adjacent terminals. Steps d), e), f), and g) in the process may be repeated several times when there is a large difference in pitch between input and output terminals, or when the complexity of the interconnection between chips makes it necessary. For example, a single layer of metal is not sufficient when it is required to connect a chip with 500 or more inputs/outputs.

The interconnection substrate then appears as an alternating stack of several layers of dielectric materials and conducting tracks.

According to a specific aspect of the invention, the metal blocks are formed by electrolysis using the layer of melting material, the conducting blocks and tracks as electrodes during step(s) g), when the meltable material is an electrical conductor.

According to another aspect of the invention, the chip(s) to be transferred may be mounted onto the interconnection substrate immediately before step h) of the process.

Furthermore, a process for the collective and simultaneous production of a large number of elementary interconnection substrates may include an additional step to cut out the interconnection substrate and/or the chip(s) into elementary parts.

After step h) of the process, it is also possible to place fastening studs and balls made of a meltable material on the output terminals. If the meltable material is electrically conducting, the conducting blocks remain covered by meltable material when the interconnection substrate is separated, and this material can thus directly form the fastening studs without the need for an additional step to form these studs if the materials in the studs and balls are compatible. If not, a deposit of a suitable material will be necessary to form the fastening studs. If the meltable material is non-conducting, it may be necessary to carry our a cleaning step before the fastening studs are formed to eliminate residual meltable materials after separation.

Other characteristics and advantages of this invention will become more apparent after reading the following description given with reference to the appended figures which are provided for illustration purposes only, without being restrictive.

DESCRIPTION OF THE INVENTION

Figure 1:
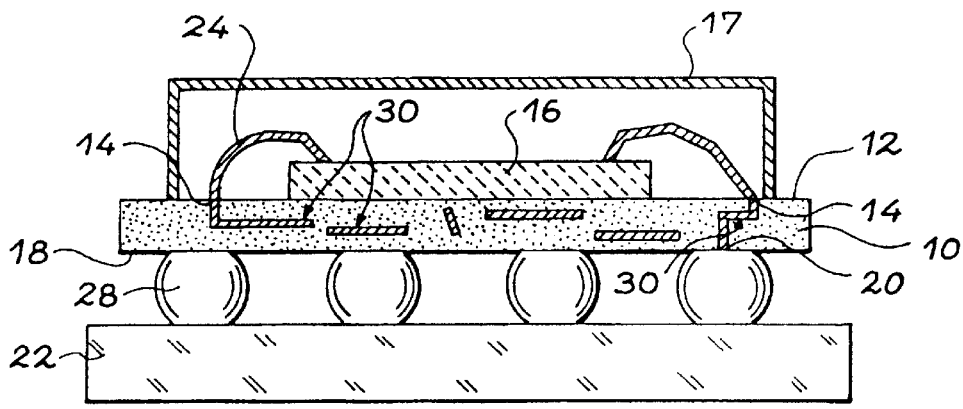
FIG. 1 described above, is a schematic cross-section through a structure with a known type of interconnection substrate connecting an electronic chip to a reception substrate, FIG. 2 described above, is a schematic cross-section through another structure also with a known type of interconnection substrate, FIG. 3 described above, is a schematic section through a known type of MCM structure comprising an interconnection substrate associated with an additional intermediate substrate which includes several electronic chips.
Figure 2:
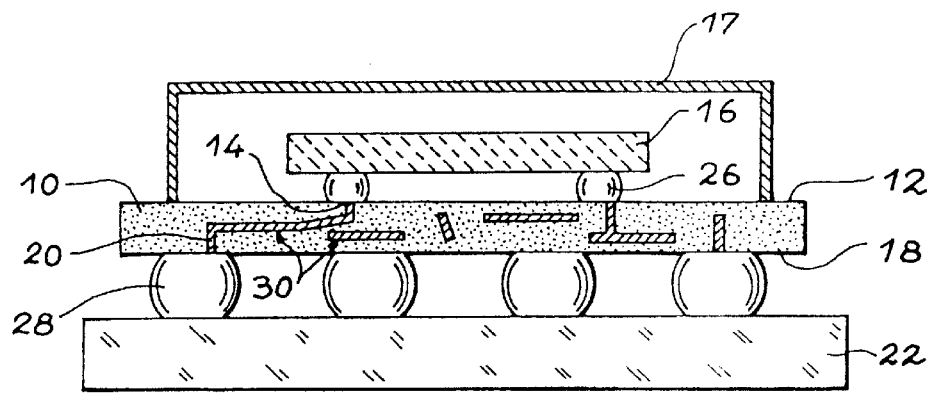
Figure 3:
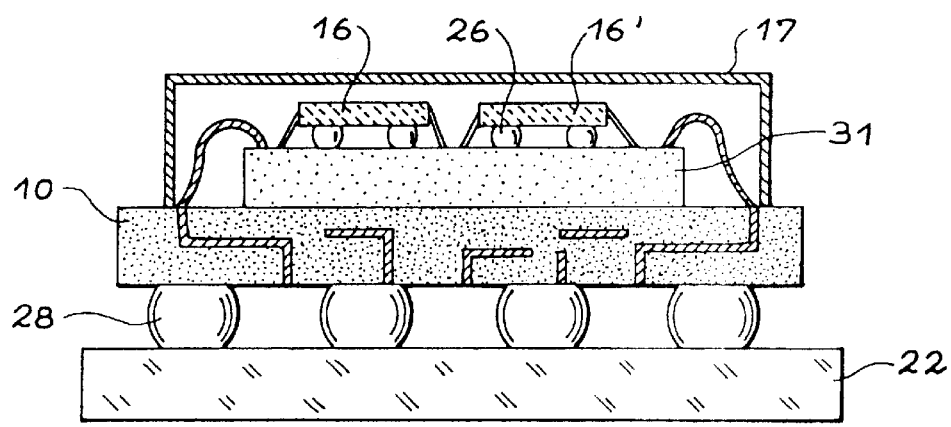
Figure 4:
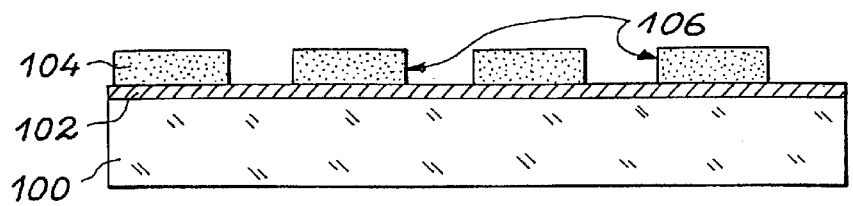
FIGS. 4 to 9 are schematic sections illustrating the manufacture of an interconnection substrate according to an embodiment of this invention.

As shown in FIG. 4, a layer of an electrical conducting meltable material 102 is formed on an initial substrate 100, for example made of silicon. This layer, which forms a continuous base, may for example be deposited by sputtering or vapor deposition to a thickness of the order of 1 μm. An advantageous material for this layer is a 60-40 SnPb tin-lead alloy, due to its melting temperature.

Figure 5:
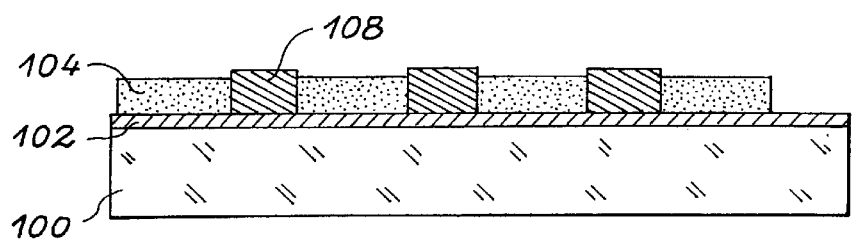

A layer of dielectric material 104, for example polyimide, is formed on layer 102 with a thickness of the order of 5 μm. This layer 104 is engraved with "opening" patterns to form openings 106 corresponding to interconnection substrate output terminals. As shown in FIG. 5, an additional step in the process is the growth by electrolysis of metal, for example copper, in the mask openings using the conducting layer 102 as electrode. Blocks 108 are thus formed.

Figure 6:
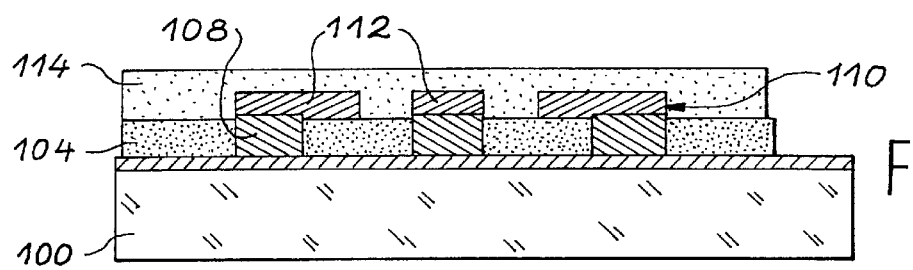

A metal layer 110, for example copper, covering blocks 108 is formed by sputtering. This layer 110 has a thickness of the order of 5 μm, and is then engraved using known lithography processes, according to track patterns in order to form conducting tracks 112 as shown in FIG. 6. Conducting tracks 112 are shaped so that they are at least partially superimposed on blocks 108, so as to be in electrical contact with these blocks. The orientation and shape of the tracks are dictated essentially by the layout and pitches of the interconnection substrate input and output terminals. Tracks 112 are then covered with a layer of dielectric material 114, for example a polyimide layer about 5 μm thick.

Figure 7:
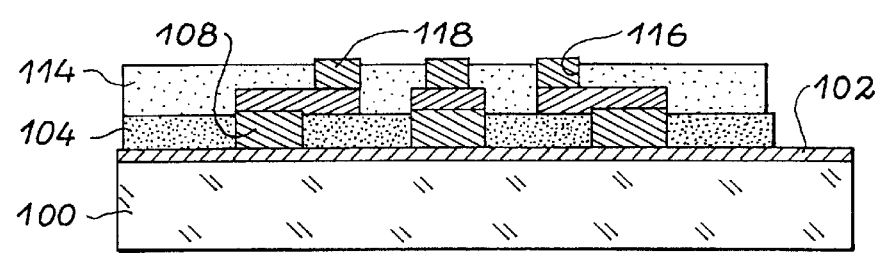

As shown in FIG. 7, the process continues by engraving the dielectric layer 114 in order to make openings 116 therein, which at least partially overlap the conducting tracks 112. Conducting blocks 118, for example made of copper, are formed in these openings 116.

Advantageously, layer 102, blocks 106 and tracks to 112 form an electrode for the growth of blocks 118 by electrolysis.

Figure 8:
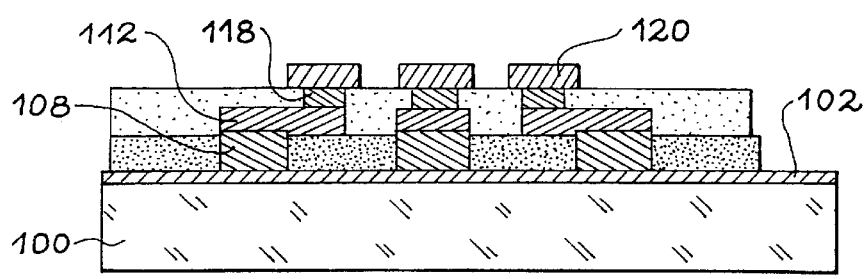

In the described embodiment, fastening studs 120 are formed respectively on the blocks to obtain the structure shown in FIG. 8. Fastening studs 120 which form the input terminals may be made, for example, by depositing a TiNiAu layer, and then by etching this layer according to a suitable pattern.

In other embodiments, it is obviously possible to add one or several metal layers in which conducting tracks are engraved and which are separated by dielectric layers and are electrically connected through metal blocks. In this case, the operations illustrated in FIGS. 6 and 7 are repeated.

Figure 9:
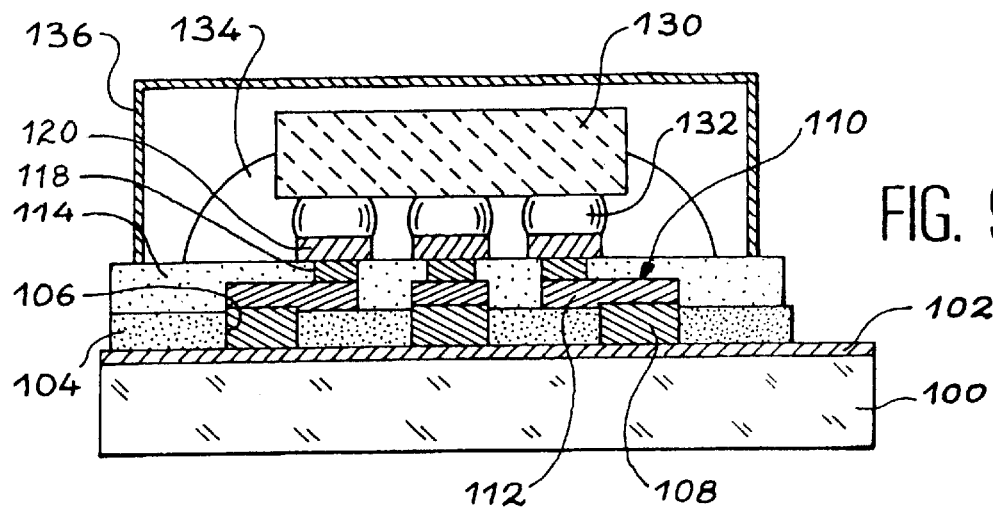
Figure 10:
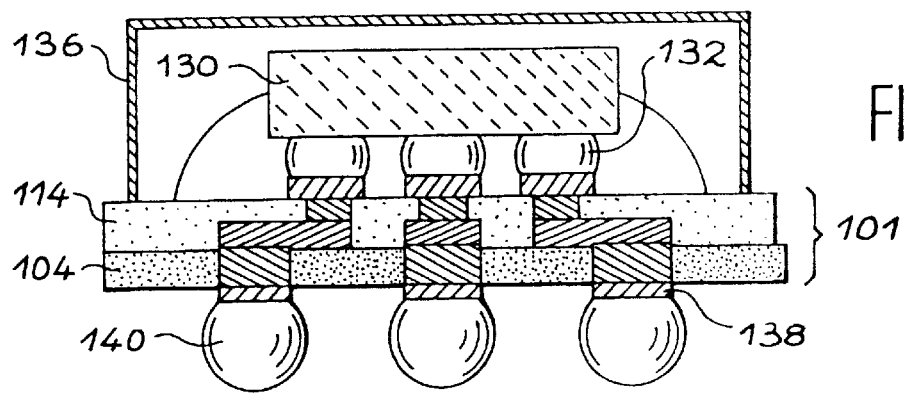
FIGS. 10 and 11 are schematic sections illustrating providing the interconnection substrate with balls of a meltable material, and transferring it on a reception substrate.

The pitch of blocks 118 and the fastening studs 120 are adapted to match the pitch of inputs and outputs of one or several chips 130. As shown in FIG. 9, such chip 130 may be connected to the interconnection substrate using meltable microballs 132. These microballs are made of an electrically conducting meltable material with a melting temperature exceeding the melting temperature of layer 102.

Thus when the material in layer 102 is a 60-40 SnPb alloy, a 5-95 SnPb alloy can for example be used for the microballs.

Advantageously, chip 130 can further be rigidly connected with the interconnection substrate 101 by means of an "Underfill" type resin 134 and protected by a cover 136.

The process continues by separating the interconnection substrate from the initial substrate 100. Separation may be easily obtained by placing the structure on a heating plate capable of heating layer 102 to a temperature exceeding the melting temperature of the material making up the structure, but preferably lower than the melting temperature of the microballs. If the 60-40 SnPb material mentioned above is used, the heating temperature is of the order of 200° C.

For example, blocks 106 that form output terminals may be covered by AuNi fastening studs 138. For example these studs 138 may be formed by chemical deposition.

The interconnection substrate may then be sawn to break it down into elementary interconnection substrates, then lined with macroballs 140 on attachment studs 138. For example, these balls 140 may be made from a 60-40 SnPb alloy.

Figure 11:
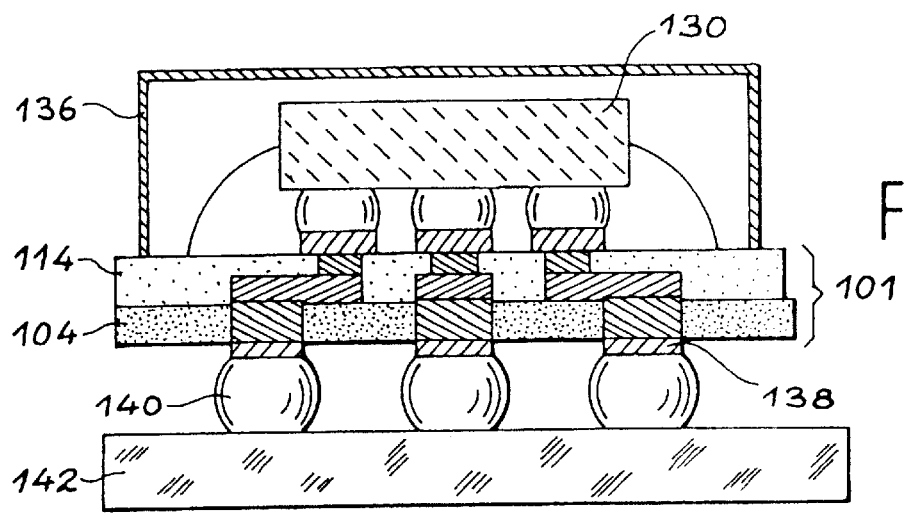

As shown on FIG. 11, the macroballs are used to transfer the interconnection layer 101 onto a reception substrate 142, which may for example be a printed circuit board or a multi-layer ceramic structure with conducting tracks (not shown). The reception substrate may also be provided with fastening studs (not shown) for this purpose.

As described above, the meltable material balls not only provide an electrical and mechanical link between the interconnection substrate and the printed circuit board, but also reduce mechanical stresses resulting in difference in expansion between the printed circuit and the interconnection substrate.

Referenced Documents

1) "Ball Grid Array" Tech Search International, INC. 1994, pp 8, 9, 12, 61, 62, 65 and 66.

2) "Thin Film Transfer Process for Low Cost MCM-D Fabrication" IEEE Transactions on Components Packaging and Manufacturing Technology, Part B, vol. 18, No. 1, February 1995, pp 42 to 46.

We claim:

1. Process for making an interconnection substrate to connect at least one electronic chip onto a reception substrate, the interconnection substrate having a first side with input terminals capable of being connected to the chip, and a second side, opposite the first side, with output terminals capable of being connected to the reception substrate, characterized in that this process includes the following steps:

a)—forming a layer of electrically conducting meltable material on an initial substrate, b)—forming a first layer of dielectric material on the meltable layer and engraving this first dielectric layer to make openings corresponding to the interconnection substrate output terminals, c)—forming first metal blocks respectively in the openings, the blocks forming the output terminals, d)—depositing a metal layer covering the metal blocks, e)—engraving the metal layer to form conducting tracks, the tracks at least partially superposing the openings formed in the first dielectric material layer, f)—forming a second dielectric material layer covering the conducting tracks and engraving this second dielectric layer to form openings therein at least partially exposing the conducting tracks, g)—forming second metal blocks in the openings formed in the second dielectric material layer, h)—separating the first dielectric layer from the initial substrate by heating the meltable material to a temperature equal to or exceeding its melting temperature to obtain the interconnection substrate.

2. Process according to claim 1, characterized in that it further includes, between steps g) and h), a step of forming fastening studs on the second metal blocks formed in step g), the fastening studs forming the input terminals.

3. Process according to claim 1, characterized in that a tin-lead alloy is used as the electrically conducting meltable material.

4. Process according to claim 1, characterized in that the first metal blocks in step c) are formed by electrolysis, using the meltable material layer as an electrode.

5. Process according to claim 1, characterized in that during step g) the second metal blocks are formed by electrolysis using the meltable material layer in the blocks and conducting tracks as electrodes.

6. Process according to claim 1, characterized in that steps d), e), f) and g) are repeated several times.

7. Process according to claim 1, characterized in that said at least one electronic chip is connected to the interconnection substrate prior to step h).

8. Process according to claim 7, characterized in that the chip is further fixed to the substrate by means of a resin.

9. Process according to claim 1, characterized in that it further comprises a step cutting the interconnection substrate.

10. Process according to claim 1, characterized in that it further comprises, after step h), placing meltable material balls on output terminals, either directly or by means of fastening studs.

11. Process according to claim 1, characterized in that polyimide is used as the dielectric material.

12. Process according to claim 1, characterized in that copper is used to form the metal blocks in the openings and to form the conducting tracks.

13. Process for making an interconnection substrate to connect at least one electronic chip onto a reception substrate, the interconnection substrate having a first side with input terminals capable of being connected to the chip, and a second side, opposite the first side, with output terminals capable of being connected to the reception substrate, characterized in that this process includes the following steps:

a)—forming a layer of electrically conducting meltable material on an initial substrate, b)—forming a first layer of dielectric material on the meltable layer and engraving this first dielectric layer to make openings corresponding to the interconnection substrate output terminals, c)—forming first metal blocks respectively in the openings, the first metal blocks forming the output terminals and being formed by electrolysis, using the meltable material layer as an electrode, d)—depositing a metal layer covering the metal blocks, e)—engraving the metal layer to form conducting tracks, the tracks at least partially superposing the openings formed in the first dielectric material layer, f)—forming a second dielectric material layer covering the conducting tracks and engraving this second dielectric layer to form openings therein at least partially exposing the conducting tracks, g)—forming second metal blocks in the openings formed in the second dielectric material layer, h)—separating the first dielectric layer from the initial substrate by heating the meltable material to a temperature equal to or exceeding its melting temperature to obtain the interconnection substrate.

* * * * *

UNITED STATES PATENT AND TRADEMARK OFFICE
CERTIFICATE OF CORRECTION

PATENT NO. : 5,861,322
DATED : January 19, 1999
INVENTOR(S) : Caillat et al.

It is certified that error appears in the above-indentified patent and that said Letters Patent is hereby corrected as shown below:

On the title page, Item [56],

References Cited, U.S. PATENT DOCUMENTS, 6th Reference, delete "Nakao et al." and insert --Shin Nakao--.

References Cited, FOREIGN PATENT DOCUMENTS, 1st Reference, delete "0 506 077 A2" and insert --0 560 077 A2--.

Column 7, Line 36, Claim 5, after "the" (second occurrence), insert --second--.

Signed and Sealed this

First Day of June, 1999

Attest:

Q. TODD DICKINSON

*Attesting Officer*     *Acting Commissioner of Patents and Trademarks*